United States Patent [19]

Kikushima

[11] Patent Number: 5,327,104
[45] Date of Patent: Jul. 5, 1994

[54] PIEZOELECTRIC OSCILLATOR FORMED IN RESIN PACKAGE CONTAINING, IC CHIP AND PIEZOELECTRIC OSCILLATOR ELEMENT

[75] Inventor: Masayuki Kikushima, Suwa, Japan

[73] Assignee: Seiko Epson Corporation, Tokyo, Japan

[21] Appl. No.: 960,832

[22] Filed: Oct. 14, 1992

[30] Foreign Application Priority Data

Oct. 21, 1991 [JP] Japan .................. 3-272769
Aug. 5, 1992 [JP] Japan .................. 4-209210

[51] Int. Cl.⁵ .................. H01L 23/12; H01L 25/065; H03B 5/36
[52] U.S. Cl. .................. 331/68; 257/667; 257/676; 257/724; 257/735; 257/787; 331/108 D; 331/158; 310/348
[58] Field of Search .......... 331/68, 108 D, 116 R, 331/116 FE, 158; 257/666, 667, 676, 724, 735, 787; 310/348

[56] References Cited

U.S. PATENT DOCUMENTS 4,916,413 4/1990 Nakayama et al. .......... 331/68
5,038,119 8/1991 Tsuchido ................. 331/158
5,229,640 7/1993 Pak ........................ 257/666

FOREIGN PATENT DOCUMENTS 63-102313 7/1988 Japan .

Primary Examiner—Siegfried H. Grimm
Attorney, Agent, or Firm—Oliff & Berridge

[57] ABSTRACT

A flat package piezoelectric oscillator, sealed with resin, and having leads or terminals includes an IC chip mounted on one side of an island portion of a lead frame, and a piezoelectric oscillator element mounted on an opposite side of the island portion. The resin package of the oscillator has at least one hole through one of opposite surfaces of the package. An injection hole for resin injection is provided along a diagonal line extending between diametrically opposed corners of the resin package, and a cylindrical case of the piezoelectric crystal oscillator element is located such that its longitudinal axis is aligned with the diagonal line to within a range from −45° to +45°. The connection portions of lead terminals for the piezoelectric oscillator element and the pads of the IC chip are located adjacent to the diagonal line. The fabrication of the piezoelectric crystal oscillator is completed by sealing the above described structure with resin.

29 Claims, 7 Drawing Sheets

PIEZOELECTRIC OSCILLATOR FORMED IN RESIN PACKAGE CONTAINING, IC CHIP AND PIEZOELECTRIC OSCILLATOR ELEMENT

BACKGROUND OF THE INVENTION

1. Field of the Invention

The present invention relates to a resin-sealed piezoelectric oscillator having leads or terminals.

2. Description of the Related Art

No conventional semiconductor devices having a flat package style also contain a piezoelectric oscillator element. FIG. 5A is a plan view showing, as an example of a flat package, a semiconductor device of QFJ (Quad Flat J-Lead Package) type. FIG. 5B is a side view of the semiconductor device of FIG. 5A. An IC chip 52 is mounted on an island portion 51 located approximately in the center of the package. Bonding wires 54 connect the pads of the IC chip 52 to the lead terminals 53 which surround the island portion 51 on its four sides. The entire structure (known as a lead frame) is then sealed with resin using transfer molding, except the outer portion of the lead terminals 53 which are left exposed. The lead terminals 53 are then subjected to cutting and bending processes.

Conventional flat package semiconductor devices (also known as plastic leaded chip carriers) cannot accommodate a piezoelectric oscillator element because the lead terminals 53 surround the island portion 51 and because the resin packages of such conventional devices are too thin.

SUMMARY OF THE INVENTION

The present invention has been developed to solve the disadvantage described above.

It is an object of the present invention to provide a compact and reliable, resin sealed, piezoelectric oscillator.

In order to achieve the above and other objects, and to overcome the shortcomings set forth above, a piezoelectric oscillator according to the present invention includes at least one IC chip mounted on one side of a lead frame, and at least one piezoelectric oscillator element mounted on an opposite side of the lead frame, the entire structure being sealed with resin. In the piezoelectric oscillator according to the present invention the IC chip is mounted on one side of the island portion of the lead frame, and the cylindrical case of the piezoelectric oscillator element is mounted on an opposite side of the island portion.

The resin package of the oscillator preferably includes at least one hole on one of opposite surfaces of the package, with both the piezoelectric oscillator element and the island portion being disposed between these opposite surfaces.

An injection hole for injecting resin is provided on one of the four corners of the package, along a diagonal line extending between diametrically opposite corners of the package. The longer direction of the cylindrical case (i.e., the longitudinal axis of the cylindrical case) of the piezoelectric oscillator element is aligned with the diagonal line along which the injection hole extends accurately to within a range from $-45°$ to $+45°$.

The pads of the IC chip for connection with the piezoelectric oscillator element are disposed adjacent to the diagonal line of the resin package, and are oriented so that the pads of the IC chip are closer to lead terminals for the piezoelectric oscillator element.

The island portion (which is also referred to as a die-pad) preferably is recessed toward the piezoelectric oscillator element in a die-pad down fashion (i.e., the island portion is depressed) to shorten the length of bonding wires attached between pads of the IC chip and lead terminals of the lead frame.

The lead terminals to be connected to the piezoelectric oscillator element preferably are provided with bend portions.

The surface area of one connection portion, connected to one lead of the piezoelectric oscillator element, and of its associated lead terminal are designed to match the surface area of the other connection portion, connected to the other lead of the piezoelectric oscillator element, and of the lead terminal associated with the other connection portion, in order to equalize the thermal conditions of the two connection portions.

The lead terminals connected to the piezoelectric oscillator element are arranged such that they are not in the way of the layout of the remaining lead terminals, in order to ensure the standardization of a cutting pattern used during fabrication.

The IC chip may be a real-time clock IC chip, and thus the piezoelectric oscillator is a real-time clock.

The IC chip may be a PLL (phase lock loop) IC chip, and thus the piezoelectric oscillator is a PLL oscillator.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

One embodiment of the present invention directed to a plastic leaded chip carrier of the QFJ (Quad Flat J-Lead Package) type and including a piezoelectric oscillator element therein will be described in detail. The present invention is not limited to this one type of package. The present invention may be applied to other packages having leads or terminals, such as, for example, QFP (Quad Flat Packages), QFI (Quad Flat I-Lead Packages), QFN (Quad Flat Non-Lead Packages), SOP (Small Outline Packages), SOJ (Small Outline J-Lead Packages), and DIP (Dual In-Line Packages).

Figure 1A:
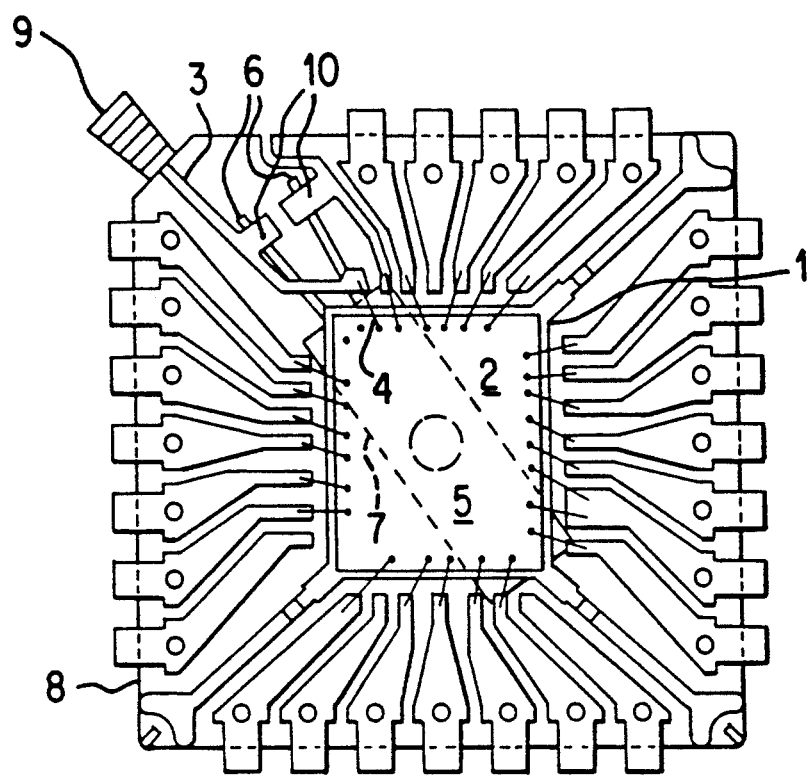
FIG. 1A is a plan view of a piezoelectric oscillator of QFJ type including a piezoelectric oscillator element, according to the present invention.
Figure 1B:
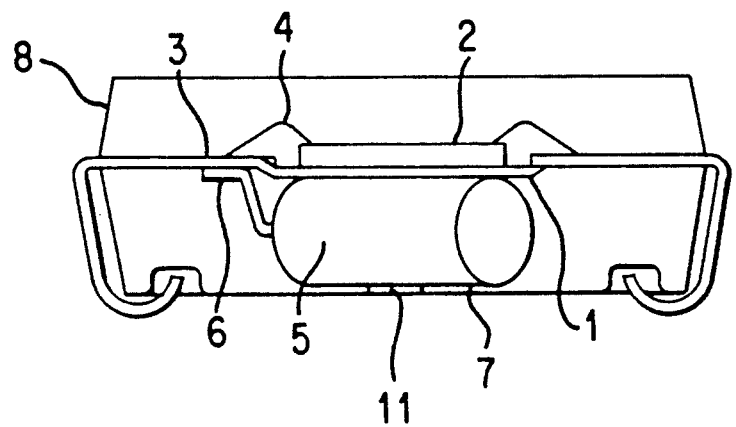
FIG. 1B is a cross-sectional view of the piezoelectric oscillator of FIG. 1A.

Referring to FIG. 1A and FIG. 1B, an embodiment of a piezoelectric crystal oscillator according to the present invention is described below. FIG. 1A is a plan view showing a piezoelectric oscillator of QFJ type including a piezoelectric oscillator element. FIG. 1B is a cross-sectional view of the piezoelectric oscillator of FIG. 1A.

An IC chip 2 is mounted on an island portion 1, and bonding wires 4 are connected between the pads of the IC chip 2 and lead terminals 3 which surround the island portion 1 along its four sides. A piezoelectric oscillator element 5 containing a square AT piezoelectric crystal element strip or the like, is mounted beneath the island portion 1 of the IC chip 2 as shown in FIG. 1B. The leads 6 of the piezoelectric oscillator element 5 are bonded, soldered, or joined using conductive adhesive, to the middle portions (connection portions 10) of lead terminals 3, which are also connected to electrodes on IC chip 2 (a gate and a drain electrode in the example of a CMOS IC) for driving the piezoelectric oscillator. The longer direction of the cylindrical case 7 of piezoelectric oscillator element 5 (i.e., the longitudinal axis of cylindrical case 7) extends substantially in the direction of a diagonal line extending between diametrically opposed corners of the resin package 8 in its finished state.

A lead frame (i.e., the combination of island portion 1 and lead terminals 3) is made in a conventional manner by fixing the island portion 1 onto the lead terminals 3, and then both the piezoelectric oscillator element 5 and the IC chip 2 are mounted on the lead frame. In particular, piezoelectric oscillator element 5 and IC chip 2 are mounted on opposite sides of island portion 1. The lead frame along with both the crystal oscillator element 5 and the IC chip 2 is set into a mold, and sealed with resin using a conventional transfer molding technique while leaving the outer portions of the lead terminals 3 exposed. The lead terminals are then subjected to cutting and bending processes to complete fabrication of the QFJ type piezoelectric oscillator.

Advantages of the present invention are described below.

To minimize the thickness of a piezoelectric oscillator, a cylindrical piezoelectric oscillator element having an outer diameter of 1.5-2 mm (for example, a 32 kHz tuning fork type piezoelectric crystal oscillator element) is mounted on a first side of island portion 1 opposite from a second side of island portion 1 on which IC chip 2 is mounted. Preferably, the longer direction of cylindrical case 7 extends along a diagonal line of the resin package 8. Due to the locations of lead terminals 3 (which are arranged around the periphery of resin package 8 with an equal pitch) an injection hole 9 for injecting resin during the transfer molding process is disposed in one of the corners of the resin package. By arranging cylindrical case 7 as described above so that the longitudinal axis thereof extends along a diagonal line between the corner having injection hole 9 and the opposite corner, no undue force is applied on the cylindrical case 7 by the resin as it flows through injection hole 9. Furthermore, since no undue force is applied to the connection portions 10 where lead terminals 3 are connected to leads 6 of piezoelectric oscillator element 5, the lead terminals 3 remain free from deformation (in an extreme case of deformation, one lead terminal touches the next lead terminal causing a serious failure) and piezoelectric oscillator element 5 remains free from unwanted displacement.

The above alignment requirement between injection hole 9 and cylindrical case 7 is not a rigorous one; the difference in angle between the longitudinal axis of cylindrical case 7 and the orientation direction of injection hole 9 may be within a range of −45° to +45°, preferably −30° to +30°.

In the above arrangement, the cylindrical case 7 of piezoelectric oscillator element 5 is disposed on a first side of the island portion 1 opposite from a second side of the island portion 1 on which the IC chip 2 is mounted. Since the QFJ semiconductor device type is constructed so that the lead terminals 3 surround the island portion 1, it is undesirable to dispose piezoelectric oscillator element 5 on a portion of the lead frame other than on the island portion 1. This is particularly so if consideration is given to displacement which may occur during the transfer molding operation.

A pin (not shown) is preferably mounted inside the mold (not shown) to support the cylindrical case 7 so that the cylindrical case 7 of the piezoelectric oscillator element 5 does not project outside the resin package during the transfer molding process. By means of the pin mounted inside the mold, a hole 11 is provided in the resin package 8 on the side of island portion 1 containing cylindrical case 7.

Figure 2:
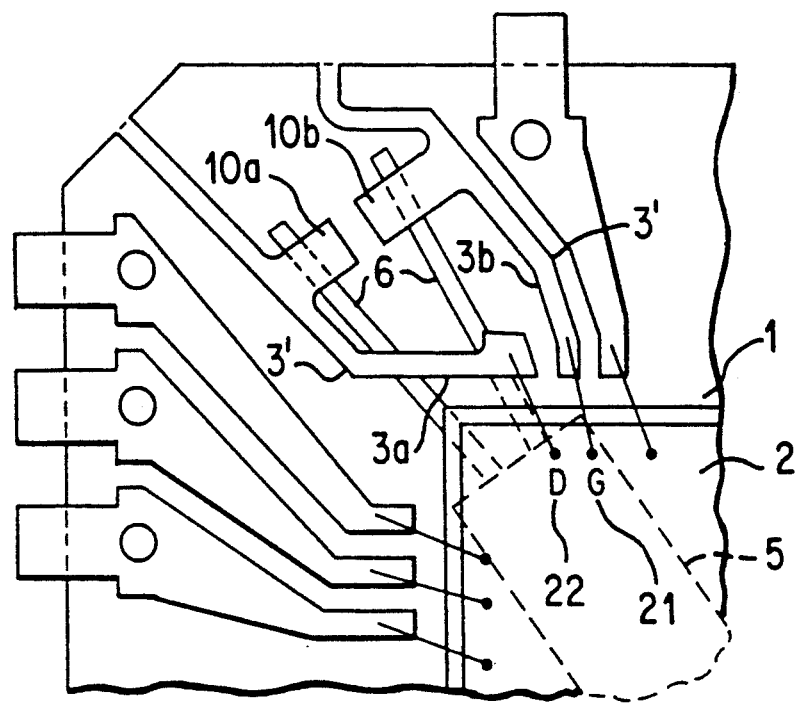
FIG. 2 is an enlarged view showing the area of connection where a piezoelectric oscillator element is connected to an IC chip.

Referring to FIG. 2, the connection portions 10a, 10b of the lead terminals 3a, 3b connected to the leads 6 of the piezoelectric oscillator element 5 preferably have bend portions 3' in order to provide a spring capability thereto. Such bend portions prevent shock received by lead terminals 3a and 3b during bonding to leads 6 from adversely affecting the wire bonding portions 4 disposed at the ends of lead terminals 3a and 3b.

To equalize the thermal conditions of the two connection portions 10a, 10b, the combined surface area of one connection portion 10a and of its associated lead terminal 3a preferably matches the combined surface area of the other connection portion 10b and of its associated lead terminal 3b; such an arrangement allows the bonding operation to be performed in a reliable manner. To this end, the lead terminals 3a, 3b may be curved as described above.

Unlike the remaining lead terminals 3, of package 8, the lead terminals 3a, 3b connected to leads 6 of piezoelectric oscillator element 5 do not extend externally of package 8. The connection between piezoelectric oscillator element 5 and IC chip 2 is internal of package 8, and thus there is no external connection to piezoelectric oscillator element 5.

As shown in FIG. 2, a gate pad and a drain pad 21, 22 are disposed adjacent to one of the four corners of IC chip 2, roughly along a diagonal line of the IC chip 2. The IC chip 2 is mounted on the island portion 1 in such a manner that the gate and drain pads 21, 22 are located near the lead terminals 3a, 3b which are to be connected to the piezoelectric oscillator element 5. This permits short interconnections for the gate and drain pads, and makes the wire bonding operation easy. The resulting short interconnections for the gate and drain pads allows the oscillator to be operated at higher frequencies.

Furthermore, a reliable device is achieved, with less interference emission characteristic and more immunity to noise.

Figure 3:
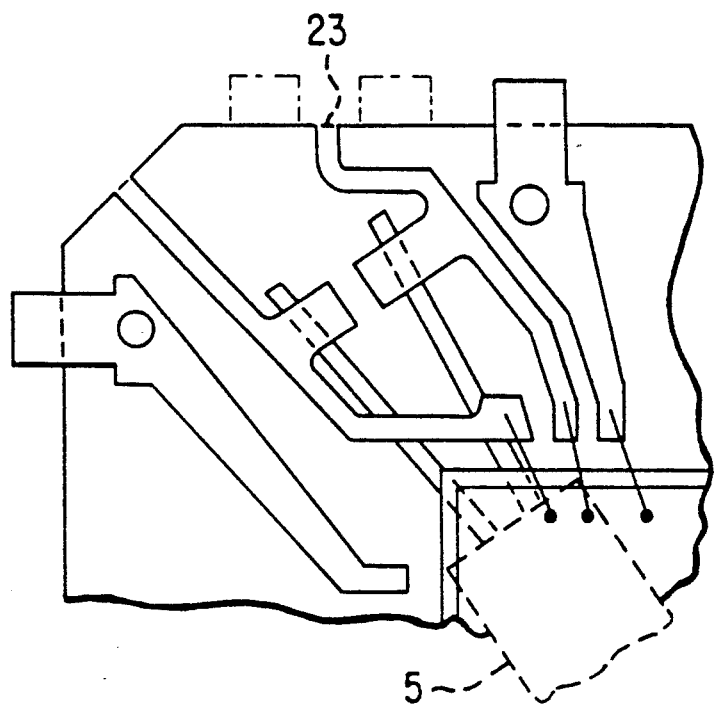
FIG. 3 is an enlarged view showing the locations of the lead terminals connected to the piezoelectric oscillator element.

As shown in FIG. 3, the lead-out positions of lead terminals 23 to which the piezoelectric oscillator element 5 is connected are placed between the usual locations of the normal lead terminals (shown with broken lines) rather than on the lead terminals themselves. The pitch of the remaining lead terminals may thus be set to be identical to that of other QFJ type semiconductor IC devices.

Figure 4:
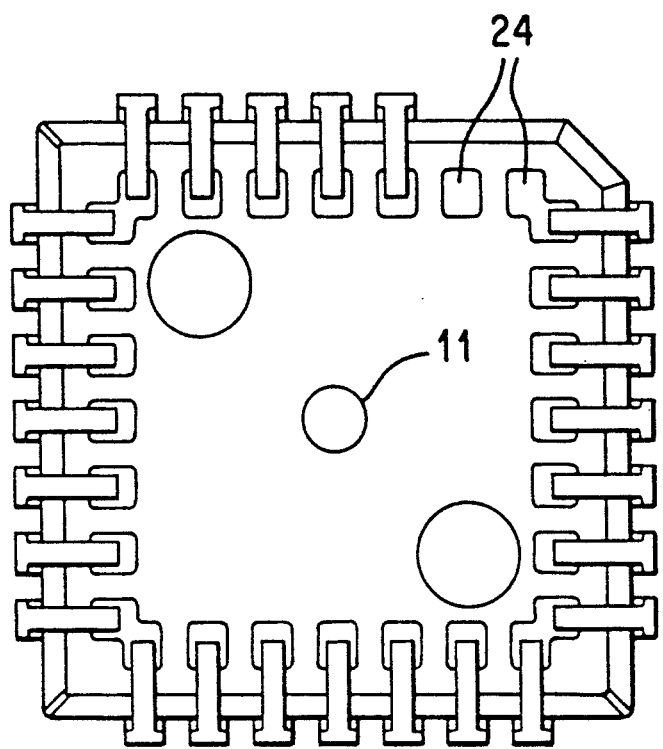
FIG. 4 is a bottom view of the FIG. 1A piezoelectric oscillator which is fabricated by using a mold for the package which has a full lead terminal layout on all four sides.
Figure 5A:
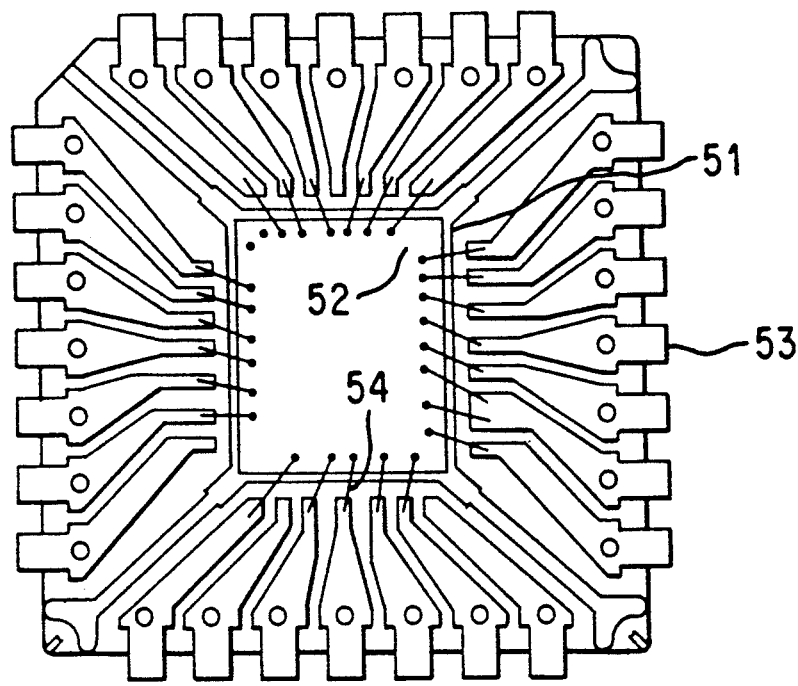
FIG. 5A is a plan view showing a conventional semiconductor device of QFJ type.
Figure 5B:
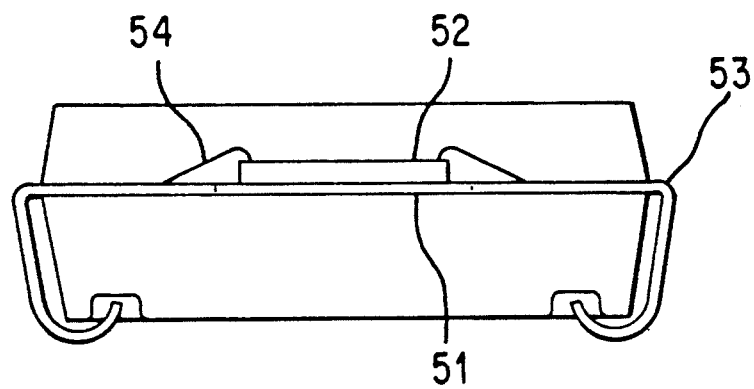
FIG. 5B is a side view of the conventional semiconductor device of FIG. 5A.

Since a cutting pattern (conventionally used to cut tie-bars (not shown) which connect each lead terminal outside of package 8) may be commonly used to form a plurality of devices (i.e., with or without piezoelectric oscillator elements 5 therein), mass-production may be effectively achieved. As shown in FIG. 4, even though portions which have no lead terminals are provided with a recess area 24, no problems are presented. FIG. 4 also shows hole 11 formed on the lower surface of package 8. The two large circles in FIG. 4 are marks left by ejector pins which eject package 8 from the mold. The ejector pin marks do not extend to any of the components inside package 8 and thus are not holes, and do not function like hole 11. The mold for other packages which have a full lead terminal layout may be employed as a mold for this package. Thus, quantity production may be equally effectively achieved, eliminating the need for additional fabrication steps.

As shown in FIG. 1B, the island portion 1 (also known as a die-pad) is recessed (depressed) from the top level of the lead terminals 3 toward the piezoelectric oscillator element 5 (this arrangement is referred to as die pad down or depressed). The IC chip pads are thus located closer to the lead terminals 3, shortening the overall length of each bonding wire 4. Also, this arrangement eliminates the possibility of the cylindrical case 7 touching the lead terminals 3. No problems are expected when the cylindrical case 7 is smaller than the island portion 1. However, when the cylindrical case 7 is larger than the island portion 1, or when the piezoelectric oscillator element 5 becomes displaced, the above arrangement is particularly advantageous.

Figure 6A:
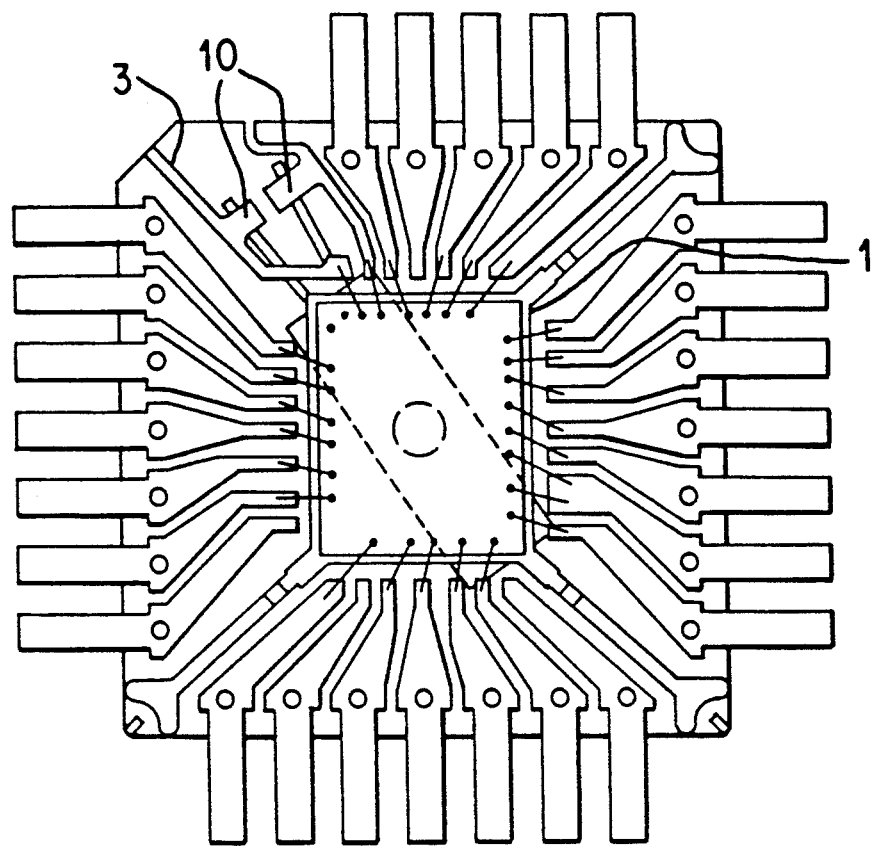
FIGS. 6A and 6B are plan and cross-sectional views, respectively, of another embodiment of the piezoelectric oscillator of QFP (Quad Flat Package) type according to the present invention.
Figure 6B:
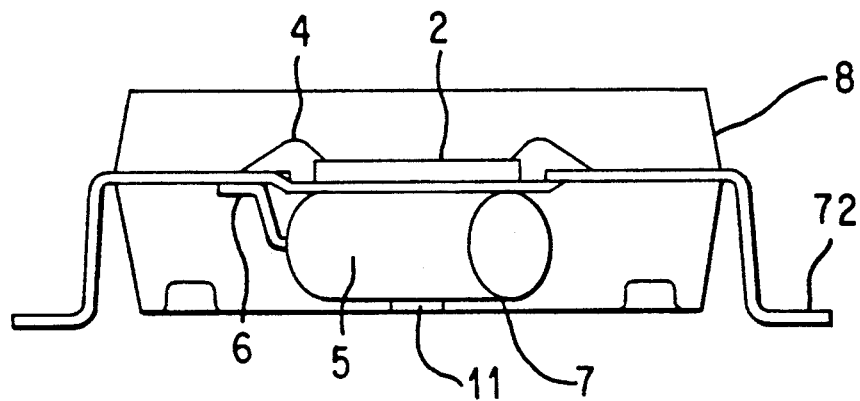

FIGS. 6A and 6B show an embodiment of a QFP type piezoelectric oscillator. Its package configuration is identical to that of the QFJ type piezoelectric oscillator illustrated in FIGS. 1A and 1B, except that outer leads 72 have a different shape.

Figure 7A:
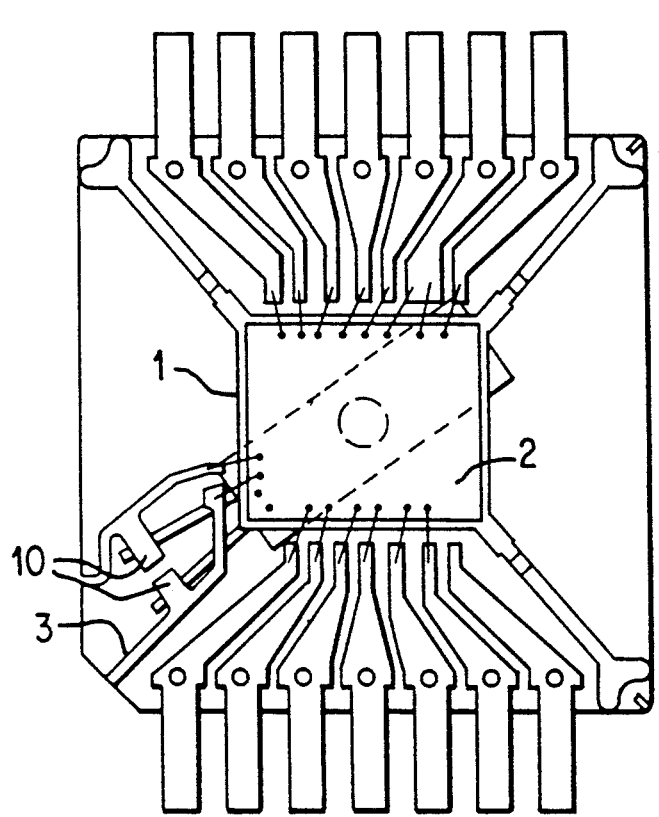
FIGS. 7A and 7B are plan and cross-sectional views, respectively, of another embodiment of the piezoelectric oscillator of SOP (Small Outline Package) type according to the present invention.
Figure 7B:
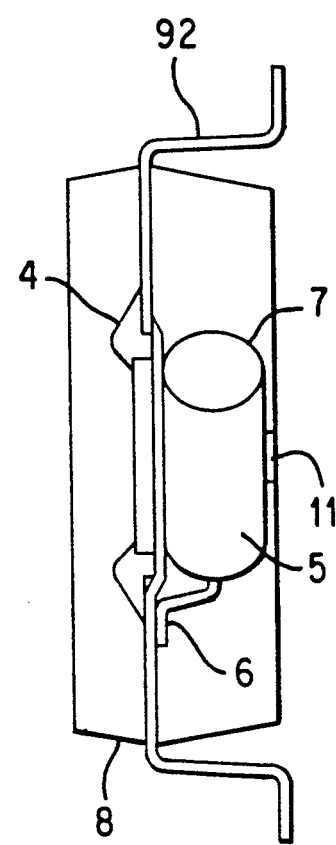

FIGS. 7A and 7B show an embodiment of an SOP type piezoelectric oscillator. Its package configuration is identical to that of the QFP type piezoelectric oscillator illustrated in FIGS. 6A and 6B, except that outer leads 92 are provided on two sides only.

Figure 8A:
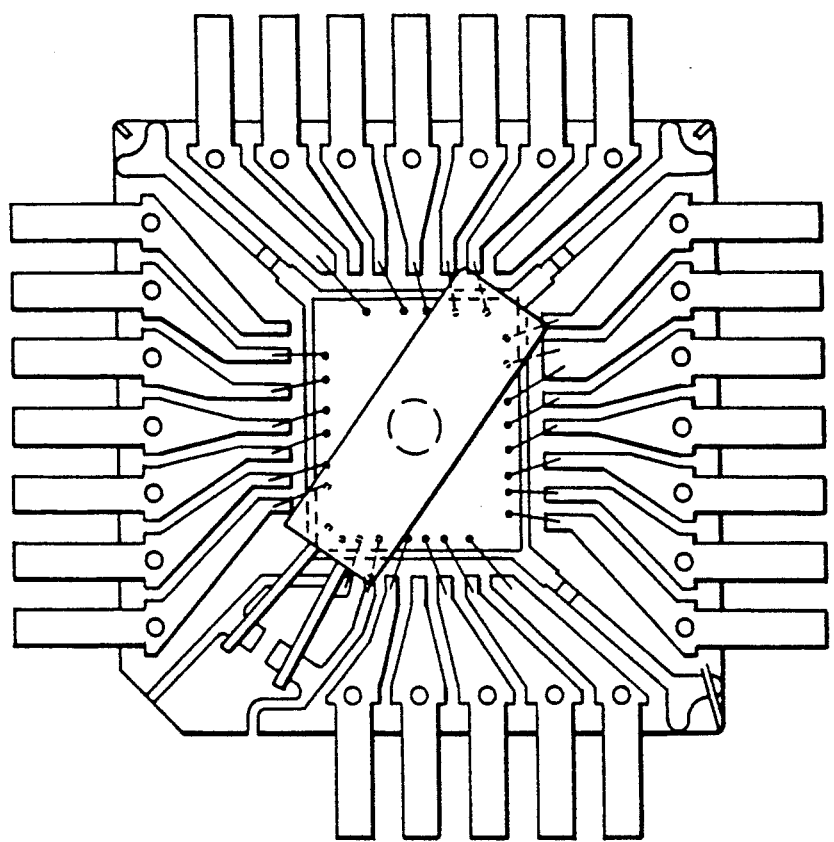
FIGS. 8A and 8B are plan and cross-sectional views, respectively, of a piezoelectric oscillator of QFP type having a hole provided on top of its package.
Figure 8B:
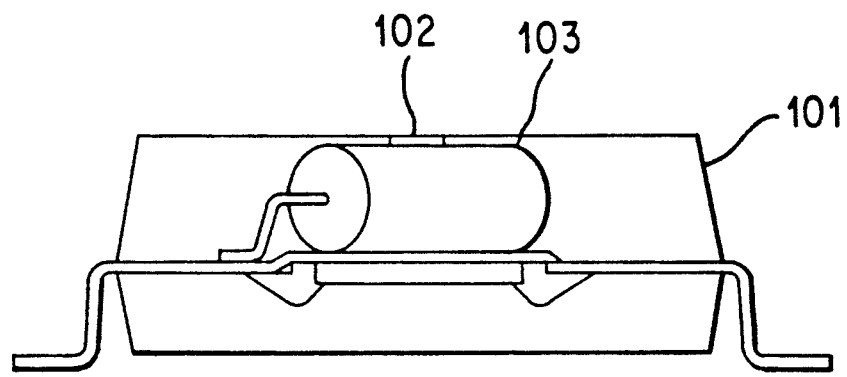

FIGS. 8A and 8B show an embodiment in which a hole 102 and piezoelectric oscillator element 103 are provided on the top of the package 101 (i.e., on the side of the package opposite from the side containing lead terminals).

Since a piezoelectric oscillator according to the present invention is provided with many terminals, it is preferably applied to a multiple-frequency output oscillator having many frequency dividers, a computer peripheral device such as a real-time clock, and a Phase Lock Loop (PLL) piezoelectric oscillator.

The real-time clock is a circuit for feeding clock information to a computer. The real-time clock employs, as a piezoelectric oscillator element, a tuning fork type oscillator element having an output frequency which is divided to generate clock data for hour, minute and second. Such data are sent to a CPU of the computer. The piezoelectric oscillator according to the present invention may be suitable as a real-time clock because the real-time clock requires numerous input/output terminals.

When the teachings of the present invention are applied to a PLL piezoelectric oscillator, the output of the piezoelectric oscillator is used as a reference signal. In this embodiment, a square AT piezoelectric oscillator element strip housed in a 2.0 mm diameter cylindrical case is employed to minimize the thickness of the package of the piezoelectric oscillator. A square AT piezoelectric oscillator element strip housed in a 3.0 mm diameter cylindrical case can be employed if required.

Furthermore, a PLL piezoelectric oscillator can be fabricated wherein a single package may contain the piezoelectric oscillator described above which generates a reference frequency and a plurality of PLL circuits so that a plurality of outputs may be provided.

By setting the frequency division ratio of each PLL circuit to a different desired value, the PLL piezoelectric oscillator may simultaneously output several signals such as a clock signal (the original reference signal may be used) or graphic control signals required for a computer. Thus a single PLL piezoelectric oscillator may provide all required signals.

According to the piezoelectric oscillator of the present invention, as detailed above, since a flat package type resin package contains a cylindrical case having a piezoelectric oscillator element therein located and fixed to one side of the island portion opposite to the side of the island portion on which the IC chip is mounted, a piezoelectric oscillator of almost the same size as an ordinary flat package semiconductor device is achieved.

Generally speaking, if IC resin packages are left unattended, they absorb moisture depending on ambient conditions. Furthermore, incorporation of these IC resin packages into a circuit by soldering may cause moisture absorbed therein to be vaporized and expanded. When the vapor pressure inside the resin package increases, stress is concentrated on the thinnest portions of the resin package.

According to the present invention, however, a hole (11 or 102) provided on the top of the package or on the bottom of the package allows moisture absorbed into the resin package to be discharged. The resin package may thus be free from cracking due to stress arising from heating during a soldering operation. Thus, a highly reliable piezoelectric oscillator is achieved.

A resin injection hole is provided on one of the corners of the resin package, along one diagonal line of the resin package, and the cylindrical case of the piezoelectric oscillator element is mounted in such a manner that the longitudinal axis of the cylindrical case is aligned with the diagonal line of the resin package, to within a range of −45° to +45° (preferably −30° to +30°). Such an arrangement prevents undue force from being applied to the piezoelectric oscillator element during resin injection so that neither displacement of the piezoelectric oscillator element nor short circuit between its leads takes place.

Since pads of the IC chip for connection with the piezoelectric oscillator element are disposed close to the diagonal line of the resin package, the shortest possible interconnections are assured between the IC chip and the piezoelectric oscillator element. The above arrangement increases immunity to noise and decreases interference.

The island portion is recessed toward the piezoelectric oscillator element in a die-pad down fashion (i.e., the island portion is depressed). This arrangement minimizes the possibility of a short circuit occurring between the cylindrical case of the piezoelectric oscillator element and the lead terminals. A highly reliable piezoelectric oscillator is thus achieved.

The cylindrical case of the piezoelectric oscillator element is located on the island portion in a manner that allows the cylindrical case of the piezoelectric oscillator element to be spaced from the lead terminals, and thus any short circuit between the lead terminals and the cylindrical case of the piezoelectric oscillator element may be effectively avoided.

The lead terminals to be connected to leads of the piezoelectric oscillator element are provided with bend portions. The bend portions act as springs, and prevent shocks arising during the mounting operation of the piezoelectric oscillator element from being transferred to the bonding wires attached between the lead terminals and the IC chip. This arrangement increases reliability of the oscillator device.

To equalize the thermal conditions of the two connection portions, the combined surface area of one connection portion and its associated lead terminal is designed to match the combined surface area of the other connection portion and its associated lead terminal; such an arrangement allows the bonding operation to be performed in a reliable manner.

The lead terminals connected to the piezoelectric oscillator element are arranged such that the lead terminals are not in the way of the layout of the remaining lead terminals. Thus, a cutting pattern may be used in a shared manner (i.e., with packages including or not including piezoelectric oscillator elements therein), without the need for arrangement of new machining equipment. Also, the mold for a resin package may be used in a shared manner. That is, the same cutting pattern and mold can be used to fabricate flat package style semiconductor devices with or without a piezoelectric oscillator element therein.

When the present invention is implemented into a PLL oscillator, a PLL IC may be connected to a piezoelectric oscillator with a minimum length possible between both. A reference clock having a minimum noise level is thus formed, and the output signal from a VCO (Voltage Controlled Oscillator) is more noise-free.

It should be noted that a reference signal generated outside the PLL IC suffers from interference of other clocks or other signals, thereby superimposing noise onto the reference signal. If the PLL IC is driven by such a noise polluted reference signal, the VCO provides a commensurately poor output signal. No mutual interference between the PLL IC and the piezoelectric oscillator element of the present invention takes place, improving output signal characteristic and making the operation of the PLL circuit reliable. A highly reliable PLL oscillator is thus achieved.

With the present invention, power consumption is reduced because routing of the reference signal is minimized. Minimized routing of the reference signal also reduces interference emissions. An excellent performance, highly reliable PLL oscillator is thus achieved.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A piezoelectric oscillator comprising at least one IC chip mounted on one surface of a lead frame, and at least one piezoelectric oscillator element mounted on an opposite surface of the lead frame, a body of said piezoelectric oscillator being molded from resin to form a rectangular resin package surrounding said at least one IC chip and said at least one piezoelectric oscillator element, said piezoelectric oscillator element having a longitudinal axis arranged to extend within a range from $-45°$ to $+45°$ of a diagonal line extending between two diametrically opposed corners of said rectangular resin package.

2. The piezoelectric oscillator according to claim 1, wherein the at least one IC chip is mounted on one surface of an island portion of the lead frame, and the at least one piezoelectric oscillator element includes a cylindrical case mounted on an opposite surface of the island portion of the lead frame, said longitudinal axis extending along a length of said cylindrical case.

3. The piezoelectric oscillator according to claim 2, wherein the resin package has at least one through hole extending through one of opposite surfaces of the resin package to an internal cavity of said resin package in which said at least one piezoelectric oscillator element is located, so as to vent said internal cavity, with both the at least one piezoelectric oscillator element and the island portion being disposed between said opposite surfaces.

4. The piezoelectric oscillator according to claim 3, wherein said resin package has four corners and an injection hole for injecting resin is provided on one of the four corners of the resin package along said diagonal line extending between said two diametrically opposed corners of the resin package, and said longitudinal axis of the cylindrical case of the at least one piezoelectric oscillator element is arranged to extend to within a range from $-45°$ to $+45°$ of said diagonal line.

5. The piezoelectric oscillator according to claim 4, wherein the IC chip includes pads for connection with the piezoelectric oscillator element disposed adjacent to the diagonal line of the of the resin package, and located on said IC chip so as to be close to lead terminals of the piezoelectric oscillator element.

6. The piezoelectric oscillator according to claim 2, wherein the island portion is recessed toward the piezoelectric oscillator element to form a depression in which said IC chip is located.

7. The piezoelectric oscillator according to claim 2, wherein lead terminals of said lead frame that are connected to leads of the piezoelectric oscillator element are provided with bend portions to absorb shock created when said piezoelectric oscillator element leads are attached to said lead terminals of said lead frame.

8. The piezoelectric oscillator according to claim 2, wherein a combined surface area of a first connection portion, connected to a first lead of the piezoelectric oscillator element, and of a lead terminal associated with said first connection portion is equal to a combined surface area of a second connection portion, connected to a second lead of the piezoelectric oscillator element, and of a second lead terminal associated with said second connection portion, in order to equalize thermal conditions of the first and second connection portions.

9. The piezoelectric oscillator according to claim 4, wherein lead terminals connected to the piezoelectric oscillator element are arranged so as to be spaced away from a layout of remaining lead terminals, in order to permit standardization of a cutting pattern used to form said lead terminals.

10. The piezoelectric oscillator according to claim 1, wherein the IC chip is a real-time clock IC chip, and the piezoelectric oscillator thus is a real-time clock.

11. The piezoelectric oscillator according to claim 1, wherein the IC chip is a phase-lock-loop IC chip, and the piezoelectric oscillator thus is a phase-lock-loop oscillator.

12. The piezoelectric oscillator according to claim 1, wherein said piezoelectric oscillator element is electrically connected to said IC chip entirely within said resin package.

13. A piezoelectric oscillator comprising:
a lead frame having an island portion and a plurality of lead terminals extending from at least one edge of said island portion, a first surface of said island portion being recessed;
an IC chip mounted on said first, recessed surface of said island portion and electrically coupled to said lead terminals;
a piezoelectric oscillator element mounted on a second surface of said island portion, opposite from said first surface, and electrically coupled to said IC chip; and
a molded resin package surrounding said island portion, said IC chip, said piezoelectric oscillator element and at least a portion of said lead terminals.

14. The piezoelectric oscillator according to claim 13, wherein said resin package has at least one through hole extending from one surface of said resin package to a surface of said piezoelectric oscillator element.

15. The piezoelectric oscillator according to claim 13, wherein said piezoelectric oscillator element includes a cylindrical case having a longitudinal axis extending parallel to a plane containing said island portion.

16. The piezoelectric oscillator according to claim 15, wherein said resin package has four corners and an injection hole for injecting resin is provided on one of the four corners of the resin package along a diagonal line extending between two diametrically opposed corners of the resin package, and the longitudinal axis of the cylindrical case of the piezoelectric oscillator element is arranged to extend to within a range from −45° to +45° of said diagonal line.

17. The piezoelectric oscillator according to claim 13, wherein said piezoelectric oscillator element is electrically coupled to said IC chip through a pair of said lead terminals of said lead frame to which leads of said piezoelectric oscillator element and pads of said IC chip are connected, said pair of lead terminals of said lead frame being entirely encapsulated within said resin package.

18. The piezoelectric oscillator according to claim 17, wherein said pair of lead terminals of said lead frame include bend portions to absorb shock created when said piezoelectric oscillator element leads are attached thereto.

19. The piezoelectric oscillator according to claim 17, wherein each of said pair of lead terminals of said lead frame includes a connection portion extending therefrom connected to a respective lead of said piezoelectric oscillator element, and a surface area of each of said lead terminals of said lead frame in said pair, including the respective connection portion thereof are equal to each other.

20. A piezoelectric oscillator comprising:
a lead frame having an island portion and a plurality of lead terminals extending from at least one edge of said island portion;
an IC chip mounted on a first surface of said island portion and electrically coupled to said lead terminals;
a piezoelectric oscillator element having a cylindrical case with a longitudinal axis, mounted on a second surface of said island portion opposite from said first surface, said piezoelectric oscillator element being electrically coupled to said IC chip;
a molded resin package surrounding said island portion, said IC chip, said piezoelectric oscillator element, and at least a portion of said lead terminals;
said resin package having four corners and an injection hole for injecting resin into said resin package, said injection hole provided on one of the four corners along a diagonal line extending between two diametrically opposed corners of said resin package, said longitudinal axis of said cylindrical case arranged in said resin package so as to extend within a range from −45° to +45° of said diagonal line.

21. The piezoelectric oscillator according to claim 20, wherein said resin package has at least one hole extending from one surface of said resin package to a surface of said piezoelectric oscillator element.

22. The piezoelectric oscillator according to claim 20, wherein said first surface of said island portion is recessed.

23. The piezoelectric oscillator according to claim 20, wherein said lead terminals extend from two opposite edges of said island portion.

24. The piezoelectric oscillator according to claim 20, wherein said island portion is rectangular so as to have four edges, and said lead terminals extend from said four edges.

25. The piezoelectric oscillator according to claim 20, wherein the IC chip is a real-time clock IC chip, and the piezoelectric oscillator thus is a real-time clock.

26. The piezoelectric oscillator according to claim 20, wherein the IC chip is a phase-lock-loop IC chip, and the piezoelectric oscillator thus is a phase-lock-loop oscillator.

27. A piezoelectric oscillator comprising at least one IC chip mounted on one side of a lead frame, and at least one piezoelectric oscillator element mounted on an opposite side of the lead frame, a body of said piezoelectric oscillator being molded from resin to form a resin package surrounding said at least one IC chip and said at least one piezoelectric oscillator element, said resin package having at least one through hole extending between one of opposite surfaces of the resin package and a surface of said at least one piezoelectric oscillator element so that an internal cavity of the resin package containing said at least one piezoelectric oscillator element is vented.

28. A piezoelectric oscillator comprising at least one IC chip mounted on one side of a lead frame, and at least one piezoelectric oscillator element mounted on an opposite side of the lead frame, a body of said piezoelectric oscillator being molded from resin to form a resin package surrounding said at least one IC chip and said at least one piezoelectric oscillator element, said resin package having four corners and an injection hole for injecting resin provided on one of the four corners of the resin package along a diagonal line extending between two diametrically opposed corners of the resin package, and a longitudinal axis of the at least one piezoelectric oscillator element arranged to extend to within a range from −45° to +45° of said diagonal line.

29. A piezoelectric oscillator comprising at least one IC chip mounted on one side of a lead frame, and at least one piezoelectric oscillator element mounted on an opposite side of the lead frame, a body of said piezoelectric oscillator being molded from resin to form a resin package surrounding said at least one IC chip and said at least one piezoelectric oscillator element, said at least one IC chip mounted on one side of an island portion of the lead frame, said at least one piezoelectric oscillator element mounted on an opposite side of the island portion of the lead frame, said island portion being recessed toward the piezoelectric oscillator element to form a depression in which said IC chip is located.

* * * * *